United States Patent
Merassi

(10) Patent No.: US 9,327,962 B2
(45) Date of Patent: May 3, 2016

(54) MEMS DEVICE AND CORRESPONDING MICROMECHANICAL STRUCTURE WITH INTEGRATED COMPENSATION OF THERMO-MECHANICAL STRESS

(71) Applicant: STMicroelectronics S.r.l., Agrate Brianza (IT)

(72) Inventor: Angelo Antonio Merassi, Caponago (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 51 days.

(21) Appl. No.: 14/189,774

(22) Filed: Feb. 25, 2014

(65) Prior Publication Data

US 2014/0252509 A1  Sep. 11, 2014

(30) Foreign Application Priority Data

Mar. 5, 2013 (IT) .............................. TO2013A0174

(51) Int. Cl.
*H01L 29/84* (2006.01)
*B81B 3/00* (2006.01)
*G01P 1/00* (2006.01)
*G01P 15/125* (2006.01)
*G01P 15/18* (2013.01)
*G01P 15/08* (2006.01)

(52) U.S. Cl.
CPC ............... *B81B 3/0072* (2013.01); *G01P 1/006* (2013.01); *G01P 15/125* (2013.01); *G01P 15/18* (2013.01); *B81B 2201/0242* (2013.01); *G01P 2015/0814* (2013.01); *G01P 2015/0831* (2013.01)

(58) Field of Classification Search
CPC ..................... B81B 3/0072; B81B 2201/0242; G01P 15/18; G01P 1/006; G01P 15/125; G01P 2015/0814; G01P 2015/0831; H01L 21/00
USPC ....................................................... 257/415
See application file for complete search history.

(56) References Cited

U.S. PATENT DOCUMENTS

| 7,520,171 B2 | 4/2009 | Merassi et al. |
| 7,646,582 B2 | 1/2010 | Lasalandra et al. |
| 2007/0119252 A1* | 5/2007 | Adams ................ G01P 15/0802 73/510 |
| 2007/0238212 A1* | 10/2007 | Merassi ................ G01P 15/125 438/48 |
| 2012/0223726 A1 | 9/2012 | Zhang et al. |

FOREIGN PATENT DOCUMENTS

| JP | 8-233854 A | 9/1996 |
| WO | 2009/145967 A1 | 12/2009 |

* cited by examiner

*Primary Examiner* — Phat X Cao
*Assistant Examiner* — Mohammad M Hoque
(74) *Attorney, Agent, or Firm* — Seed IP Law Group PLLC

(57) ABSTRACT

A micromechanical structure of a MEMS device, integrated in a die of semiconductor material provided with a substrate and having at least a first axis of symmetry lying in a horizontal plane, has a stator structure, which is fixed with respect to the substrate, and a rotor structure, having a suspended mass, mobile with respect to the substrate and to the stator structure as a result of an external action, the stator structure having fixed sensing electrodes capacitively coupled to the rotor structure; a compensation structure is integrated in the die for compensation of thermo-mechanical strains. The compensation structure has stator compensation electrodes, which are fixed with respect to the substrate, are capacitively coupled to the rotor structure, and are arranged symmetrically to the fixed sensing electrodes with respect to the first axis of symmetry.

22 Claims, 8 Drawing Sheets

MEMS DEVICE AND CORRESPONDING MICROMECHANICAL STRUCTURE WITH INTEGRATED COMPENSATION OF THERMO-MECHANICAL STRESS

BACKGROUND

1. Technical Field

The present disclosure relates to a MEMS (microelectromechanical systems) device and to a corresponding micromechanical structure, with integrated compensation of thermo-mechanical stress (or strain). The following description will make particular reference, without this implying any loss of generality, to an inertial sensor device, such as a linear accelerometer.

2. Description of the Related Art

As is known, micro-machining techniques for semiconductor devices enable manufacturing of micromechanical structures within layers generally of semiconductor material, which have been deposited (for example, a layer of polycrystalline silicon) or grown (for example, an epitaxial layer) on sacrificial layers, which are removed via chemical etching.

For example, MEMS inertial sensor devices are known, including at least one micromechanical structure integrated in a die of semiconductor material and having mobile regions (the so-called "rotor regions") suspended with respect to a substrate of the die, and fixed regions (the so-called "stator regions") anchored and fixed with respect to the same substrate and in particular to a package of the MEMS device. The mobile regions are connected to anchorages fixed with respect to the substrate via interposition of elastic biasing elements (springs). In the presence of a quantity to be detected (for example, an acceleration), the mobile regions move by inertial effect with respect to the fixed regions, along one or more axes, which constitute the sensing axes of the sensor.

When a sensing capacitive principle is adopted, the mobile regions and the fixed regions are capacitively coupled to form sensing capacitors, the sensing capacitance of which has a value that is a function of the inertial movement of the mobile regions, and hence of the quantity to be detected.

The various regions forming the micromechanical structure may have different coefficients of thermal expansion, especially in the case where they undergo different dopings. Moreover, the material (typically plastic or ceramic) of which the package of the MEMS device housing the micromechanical structure is made has a different coefficient of thermal expansion with respect to the material of which the structure itself is made (generally, monocrystalline or polycrystalline silicon).

Stress deriving from the welding processes, or in general from thermal gradients generated during use of the MEMS device, are transferred from the package to the silicon die in which the micromechanical structure is provided.

Consequently, thermo-mechanical stress may arise in the die (for example, according to the phenomenon known as "die warpage"), and in particular strains may be transferred to the anchorages of the mobile regions and/or the fixed regions, even acting in a different and non-uniform way on the various anchorage points, which many undergo minor relative displacements with respect to one another. In general, tensile and compressive stresses may be generated, and the mutual position of the various parts of the structure may be modified.

Due to the above phenomenon, a variation of the sensing capacitance may thus be generated, even without the inertial quantity to be detected (for example, in the absence of an acceleration), with a resulting deviation (drift or offset) of the output value supplied by the MEMS device.

This entails alterations in the performance of the MEMS device, in particular measurement errors and drifts, which may even vary according to the production lot, and at times also among sensors belonging to one and the same production lot; these alterations may also vary in time.

In order to compensate for the aforesaid measurement drifts, a wide range of solutions has consequently been proposed.

In particular, some solutions generally envisage electronic compensation of the thermal drifts of measurement supplied by the micromechanical structure via the introduction of appropriate electronic components in the reading interface associated to the structure in the MEMS device, usually as an ASIC (Application-Specific Integrated Circuit).

For instance, a known solution envisages the use of a temperature sensor in the reading electronics associated to the micromechanical structure. Once the temperature is known, any drift of the system is compensated electronically by resorting to compensation curves previously obtained via appropriate calibration and/or simulation procedures.

Solutions of this kind are, however, burdensome in so far as they demand costly and delicate measurement procedures to obtain compensation curves that map accurately any thermal drifts of the sensors, and purposely devised compensation operations. In addition, the degree of precision that can be achieved is not in general altogether satisfactory and repeatable.

Other solutions that have been proposed hence envisage an integrated compensation of the thermo-mechanical stress by introduction of structural compensation elements in the same micromechanical structure.

For example, U.S. Pat. No. 7,646,582 discloses a MEMS device in which, in addition to a micromechanical sensing structure, a micromechanical compensation structure is present, altogether similar to the micromechanical sensing structure, and is designed to feel the same thermo-mechanical stress and to be insensitive to the inertial quantities to be detected (in particular, linear accelerations).

The above solution, although advantageously providing an effective integrated compensation, utilizes, however, a considerable use of resources in terms of area occupied in the die of semiconductor material, given that it envisages the presence of a compensation mass (altogether similar to the inertial sensing mass), with associated electrodes, elastic elements, and anchorages. This solution is consequently difficult to implement in the case where the reduction in size and costs constitute an important design specification (as, for example, in the case of portable applications).

A further known solution, disclosed in U.S. Pat. No. 7,520, 171 envisages the presence of only some integrated compensation elements, without replicating the entire micromechanical sensing structure and hence without requiring the presence of a further mass. The particular solution described in the patent enables, however, just compensation of planar strains (i.e., ones acting in a horizontal plane of main extension of the structure), parallel to the substrate of the die, but does not enable compensation of strain components acting out of the horizontal plane (in particular, acting in a vertical direction, orthogonal to the horizontal plane).

BRIEF SUMMARY

One or more embodiments of the present disclosure are directed to a MEMS device including at least one micromechanical structure having an improved integrated compensation of the temperature and of thermo-mechanical stress.

One embodiment is directed to a micromechanical structure having a first axis of symmetry and integrated in a die of semiconductor material. The micromechanical structure comprises a substrate and a stator structure that is fixed with respect to said substrate and includes fixed sensing electrodes. The micromechanical structure further includes a rotor structure having a suspended mass that is mobile with respect to said substrate and to the stator structure in response to an external acceleration. The fixed sensing electrodes are capacitively coupled to said rotor structure. The structure further includes a compensation structure configured to compensate for thermo-mechanical strains that act within said micromechanical structure. The compensation structure includes stator compensation electrodes that are fixed with respect to said substrate and are capacitively coupled to said rotor structure. The compensation electrodes are symmetrically arranged to the fixed sensing electrodes with respect to the first axis of symmetry.

BRIEF DESCRIPTION OF THE SEVERAL VIEWS OF THE DRAWINGS

For a better understanding of the present disclosure, preferred embodiments thereof are now described purely by way of non-limiting example and with reference to the attached drawings, wherein.

DETAILED DESCRIPTION

As will be discussed in detail hereinafter, the general idea underlying the present disclosure envisages integrating, within a micromechanical structure having sensing electrodes, a suitable arrangement of compensation electrodes, arranged in such a way as to be subjected, in the presence of thermo-mechanical stress, to the same strains, loads or displacements of the sensing electrodes.

In the resulting micromechanical structure, which in the specific case operates according to the capacitive principle, there are hence defined: sensing capacitors, the capacitance of which varies as a function of an inertial quantity to be detected, for example a linear acceleration, and is moreover affected by thermo-mechanical stress; and moreover compensation capacitors, the capacitance of which is a function of the same thermo-mechanical stress.

Consequently, it is possible to proceed to an appropriate combination of the values of capacitance of the aforesaid sensing and compensation capacitors to obtain a resulting signal that is a function of just the inertial quantity to be detected and is insensitive to thermo-mechanical stress. For example, this combination operation may be performed directly in an ASIC associated to the micromechanical structure in the MEMS device.

Figure 1:
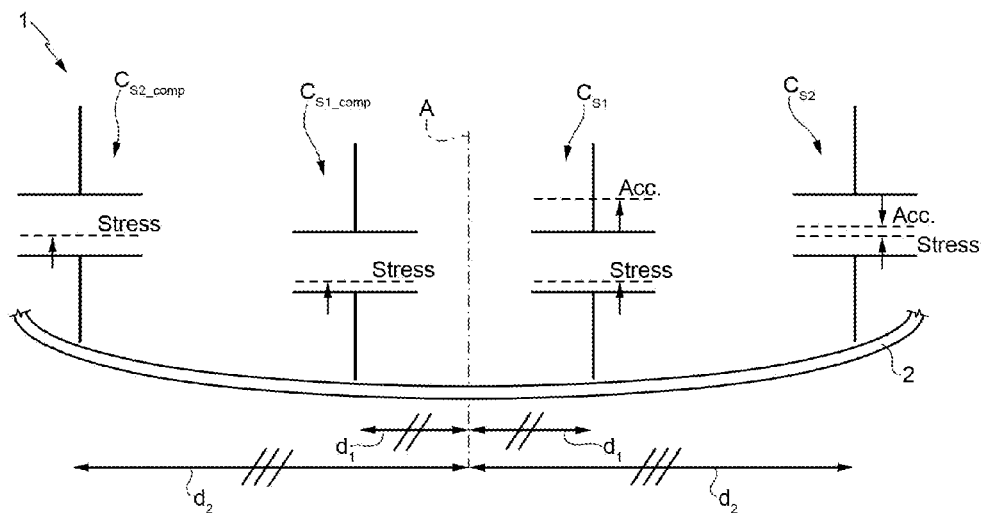
FIG. 1 is a schematic representation of a micromechanical structure with integrated compensation of thermo-mechanical stress, according to an aspect of the present solution.

By way of example, FIG. 1 is a schematic illustration of the operating principle of the solution proposed, in the case where the micromechanical structure, designated as a whole by 1, implements a differential sensing scheme, including, for this purpose, a first sensing capacitor $C_{s1}$ and a second sensing capacitor $C_{s2}$, which are designed to undergo opposite capacitive variations as a function of the inertial quantity to be detected (in the specific case, an acceleration, designated by Acc).

In a way not illustrated in detail herein, the sensing capacitors $C_{s1}$, $C_{s2}$ are defined between mobile sensing electrodes, which are attached to an inertial mass, and fixed sensing electrodes, which are fixed with respect to a substrate, designated as a whole by 2, of the micromechanical structure 1.

The above sensing capacitors $C_{s1}$, $C_{s2}$ are moreover designed to undergo variations of their capacitance value on account of the thermo-mechanical stress; in particular, the mechanical strains (represented schematically in FIG. 1), and the resulting capacitive variations are a function of the position of the sensing electrodes with respect to a central axis of symmetry, here designated as a whole by A, of the micromechanical structure 1, in particular of a corresponding die integrating the micromechanical structure 1.

As shown schematically in FIG. 1, the thermo-mechanical stress typically causes a cup-shaped deformation of the substrate 2 of the micromechanical structure 1, and the value of this deformation increases as the distance from the central axis of symmetry A increases (a first distance associated to the first sensing capacitor $C_{s1}$ is designated by $d_1$ in FIG. 1, and a second distance, greater than the first distance $d_1$, associated to the second sensing capacitor $C_{s2}$ is designated by $d_2$).

In the example illustrated, a first compensation capacitor $C_{s1\text{-}comp}$ and a second compensation capacitor $C_{s2\text{-}comp}$ are moreover provided, which are insensitive to the inertial quantity to be detected and are moreover designed to undergo, as a function of the thermo-mechanical stress, variations corresponding to those felt by the sensing capacitors $C_{s1}$, $C_{s2}$.

In a way not illustrated in detail herein, the compensation capacitors $C_{s1\text{-}comp}$, $C_{s2\text{-}comp}$ are defined between fixed compensation electrodes, which are fixed with respect to the substrate 2 of the micromechanical structure 1 and are arranged in a way symmetrical to corresponding fixed sensing electrodes, with respect to the central axis of symmetry A.

In particular, the aforesaid first distance $d_1$ is consequently associated to the first compensation capacitor $C_{s1\text{-}comp}$, and the second distance $d_2$ from the central axis of symmetry A is associated to the second compensation capacitor $C_{s2\text{-}comp}$. Hence, the same mechanical strains to which the sensing capacitors $C_{s1}$ and $C_{s2}$ are subjected, are respectively associated to the compensation capacitors $C_{s1\text{-}comp}$, $C_{s2\text{-}comp}$.

In the structure described, it is possible to obtain a sensing signal $Sig_1$, of a differential type, as a function of the difference between the capacitance values of the sensing capacitors $C_{s1}$, $C_{s2}$:

$$Sig_1 = f(C_{s1} - C_{s2})$$

The value of this sensing signal $Sig_1$ is proportional to the inertial quantity to be detected and moreover depends on the amount of the thermo-mechanical stress acting on the micromechanical structure 1.

In addition, it is possible to obtain a compensation signal $Sig_2$, as a function of the difference between the capacitance values of the compensation capacitors $C_{s1\text{-}comp}$, $C_{s2\text{-}comp}$:

$$Sig_2 = f(C_{s1\text{-}comp} - C_{s2\text{-}comp})$$

The value of the compensation signal $Sig_2$ is proportional to just the thermo-mechanical strain acting on the micromechanical structure 1.

It is hence possible to implement an appropriate combination, in particular an operation of subtraction, of the sensing signal $Sig_1$ and the compensation signal $Sig_2$, to obtain a resulting signal $Sig_r$, the value of which is temperature compensated, being preferably insensitive to thermo-mechanical stress and thermal drifts:

$$Sig_r = Sig_1 - Sig_2$$

Figure 3:
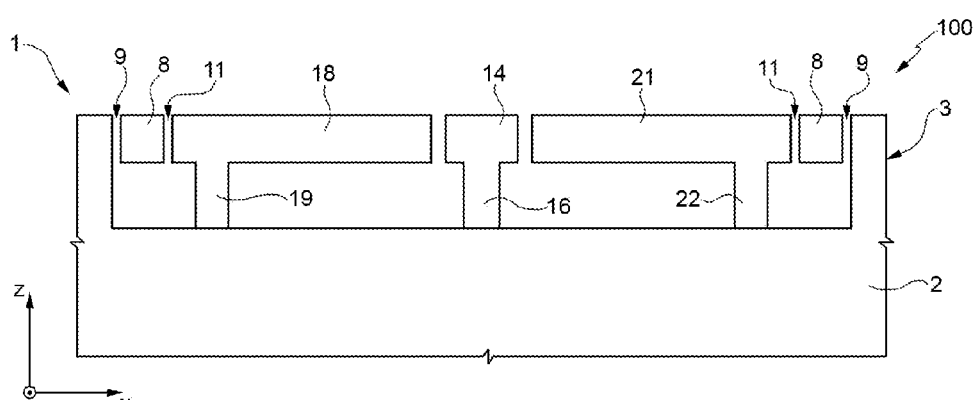
FIG. 3 is a schematic cross-sectional view of part of the MEMS device of FIG. 2, taken along line III-III of FIG. 2.
Figure 2:
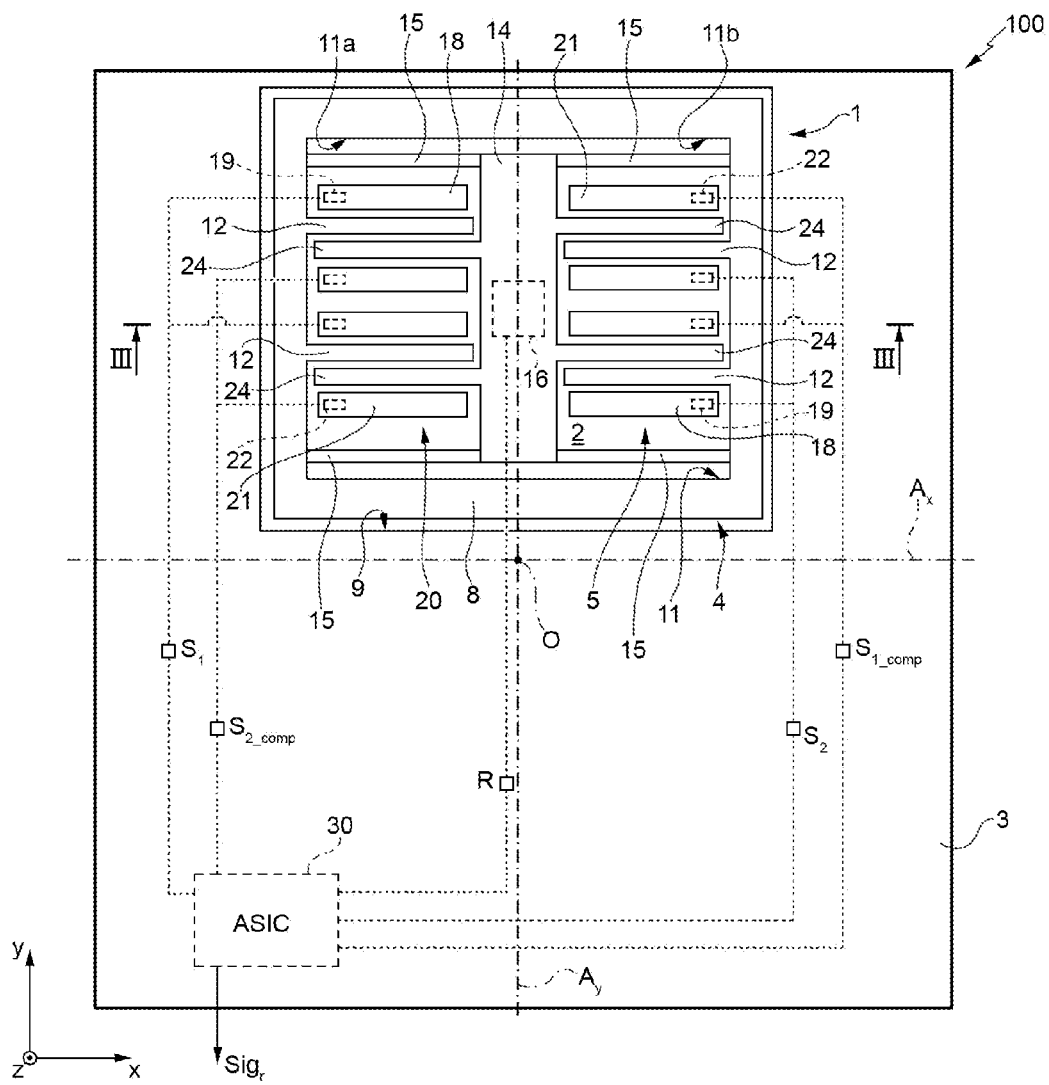
FIG. 2 is a schematic top plan view of a first embodiment of a MEMS device, including a uniaxial micromechanical structure with integrated compensation of the thermo-mechanical stress, referred to a planar movement.

With reference to FIGS. 2 and 3, a first embodiment of a MEMS device 100 is now described, made with the technique of semiconductor micro-machining, which includes the micromechanical structure 1 and, in the example, is designed to implement a uniaxial linear accelerometer.

The micromechanical structure 1 has a main extension in a horizontal plane xy, defined by a first horizontal axis x and by a second horizontal axis y, and a substantially negligible extension (or in any case an extension sensibly smaller with respect to the main extension) along a vertical axis z, orthogonal to the horizontal plane xy. The micromechanical structure 1 is designed to detect a first component of planar linear acceleration in the horizontal plane xy, in the example acting along the second horizontal axis y.

The micromechanical structure 1 is integrated in a die 3 of semiconductor material, which has a first axis of symmetry $A_x$, parallel to the first horizontal axis x, and a second axis of symmetry $A_y$, parallel to the second horizontal axis y, which crosses the first axis of symmetry $A_x$ at the geometrical center O of the die 3.

In this first embodiment, the micromechanical structure 1 is arranged in a way substantially symmetrical with respect to the second axis of symmetry $A_y$, and, in the example illustrated, entirely on one and the same side of the first axis of symmetry $A_x$.

In detail, the micromechanical structure 1 is formed by a mobile, or rotor, structure 4, which is mobile with respect to the acceleration to be detected, and by a fixed, or stator, structure 5, which is fixed with respect to the same acceleration to be detected and fixed with respect to the substrate 2 of the micromechanical structure 1.

The rotor structure 4 comprises a suspended mass 8, in the example, having a substantially square-frame shape in the horizontal plane xy, surrounded by a trench 9 separating it from a fixed part of the die 3.

The suspended mass 8 defines inside it an opening or window 11, of a square shape, having two sides parallel to the first horizontal axis x and two sides parallel to the second horizontal axis y.

The rotor structure 4 further comprises a plurality of mobile sensing electrodes 12 (the number of which illustrated in FIG. 2 is purely indicative), having an elongated finger-like conformation, which extend starting from the suspended mass 8 towards the inside of the window 11, parallel to the first horizontal axis x.

The mobile sensing electrodes 12 are electrically connected together and to one and the same rotor electrical-connection, or biasing, pad (shown schematically and designated by R just in FIG. 2).

The suspended mass 8 is supported and elastically biased by means of a suspension structure, comprising a suspension body 14 and elastic elements 15, which enable movement thereof along the second horizontal axis y, by the inertial effect, as a function of the acceleration to be detected acting on the micromechanical structure 1.

At least part of the suspension body 14, as likewise the suspended mass 8, are preferably perforated so as to allow possible release thereof during the machining process, via removal by chemical etching of an underlying sacrificial-oxide layer (in a known way, not described in detail herein).

The suspension body 14, having a rectangular shape elongated along the second horizontal axis y, is located at the center of the window 11, in a position corresponding to the second axis of symmetry $A_y$, and is fixed with respect to a rotor anchorage portion 16 anchored to the substrate 2 of the die 3, and set centrally with respect to the same suspension body 14. The window 11 is divided substantially in two halves 11a, 11b by the suspension body 14 and by the second axis of symmetry $A_y$.

As illustrated also in FIG. 3, the rotor anchorage portion 16 extends, for example, like a column along the vertical axis z, from the suspension body 14 as far as the substrate 2.

The elastic elements 15 are constituted, in the example, by four linear springs, which extend, aligned in twos, starting from the edges of the suspension body 14. In particular, the elastic elements 15 have a thin elongated shape, parallel to the first horizontal axis x, and connect the suspension body 14 to the suspended mass 8.

The stator structure 5 is positioned inside the window 11, and comprises a plurality of fixed sensing electrodes 18 (the number of which, as represented in FIG. 2, is purely indicative), each of which is fixed with respect to a respective stator anchorage portion 19, anchored to the substrate 2 of the die 3.

As illustrated in FIG. 3, each stator anchorage portion 19 extends, for example, as a column along the vertical axis z, from the respective fixed sensing electrode 18 as far as the substrate 2.

The fixed sensing electrodes 18 have an elongated finger-like conformation, parallel to the first horizontal axis x, and are parallel to, and facing, a respective mobile sensing electrode 12. In particular, the configuration of the mobile and fixed sensing electrodes 12, 18 is of the single-sided type, i.e., each mobile sensing electrode 12 is capacitively coupled to a single fixed sensing electrode 18.

The mutual position of the fixed sensing electrodes 18 and of the mobile sensing electrodes 12 along the second horizontal axis y is opposite in the two halves 11a, 11b into which the window 11 is divided by the suspension body 14, in such a way that, as a result of the inertial movement, the mutual distance between the capacitively coupled electrodes increases in a first half 11a (11b) and decreases in the second half 11b (11a).

The fixed sensing electrodes 18 belonging to each of the two aforesaid halves 11a, 11b are shortcircuited with respect to one another and electrically connected, respectively, to a first stator electrical-connection, or biasing, pad, and to a second stator electrical-connection, or biasing, pad (represented schematically only in FIG. 2 and designated by $S_1$ and $S_2$).

According to one aspect of the present solution, the micromechanical structure 1 further comprises a compensation structure 20, of a micromechanical type, integrated within the same die 3 of the MEMS device 100.

In detail, the compensation structure 20 comprises a plurality of stator compensation electrodes 21, arranged within the window 11, in a position symmetrical to the fixed sensing electrodes 18 with respect to the second axis of symmetry $A_y$.

Each stator compensation electrode 21 set in a first half 11a (or second half 11b) of the window 11 is symmetrical, with respect to the second axis of symmetry $A_y$, to a respective fixed sensing electrode 18 set in a second half 11b (or first half 11a) of the same window 11.

The fixed sensing electrodes 18 and the corresponding stator compensation electrodes 21 are hence at the same distance from the second axis of symmetry $A_y$ of the die 3. In addition, each stator compensation electrode 21 is at the same distance from the first axis of symmetry $A_x$ of the micromechanical structure 1 with respect to the corresponding fixed sensing electrode 18, hence undergoing the same mechanical strains in the presence of thermo-mechanical stress (and the ensuing cup-shaped warpage of the substrate 2 of the die 3).

The geometrical shape and the dimensions of the stator compensation electrodes 21 basically correspond to the geometrical shape and dimensions of the fixed sensing electrodes 18.

Each stator compensation electrode 21 is fixed with respect to the substrate 2 and rigidly connected thereto, and in particular is fixed with respect to a respective compensation anchorage portion 22, anchored to the substrate 2 of the die 3, in such a way as to be fixed with respect to the inertial quantity to be detected. Each compensation anchorage portion 22 extends, for example, as a column along the vertical axis z, from the respective stator compensation electrode 21 as far as the substrate 2.

The sets of stator compensation electrodes 21 arranged in each of the two halves 11a, 11b of the window 11 are short-circuited to one another and electrically connected to a respective first compensation electrical-connection, or biasing, pad and to a respective second compensation electrical-connection, or biasing, pad (represented schematically only in FIG. 2 and designated by $S_{1-comp}$ and $S_{2-comp}$).

The compensation structure 20 further comprises a plurality of rotor compensation electrodes 24 electrically shortcircuited to the mobile sensing electrodes 12 of the rotor structure 4 and to the rotor electrical-connection pad R. The rotor compensation electrodes 24 are carried fixedly by the suspension body 14 so as to be fixed with respect to the rotor anchorage portion 16 and fixed with respect to the substrate 2 of the die 3 and to the inertial quantity to be detected.

The rotor compensation electrodes 24 are arranged in the halves 11a, 11b of the window 11, each facing a respective stator compensation electrode 21, set alongside a respective mobile sensing electrode 12 along the second horizontal axis y. The mutual position of the stator and rotor compensation electrodes 21, 24 along the second horizontal axis y is opposite in the two halves 11a, 11b into which the window 11 is divided by the suspension body 14.

In the embodiment illustrated, moreover, each rotor compensation electrode 24 set in a first half 11a (11b) of the window 11 is aligned, parallel to the first horizontal axis x, to a corresponding mobile sensing electrode 12 set in the second half 11b (11a) of the same window 11.

It follows that, in a condition at rest (i.e., in the absence of the inertial quantity to be detected), the distance of each stator compensation electrode 21 from the facing rotor compensation electrode 24 is substantially equal to the distance of the corresponding (i.e., symmetrical with respect to the axis of symmetry) fixed sensing electrode 18 from the mobile sensing electrode 12 facing it.

In the micromechanical structure 1 there are hence defined: the first and second sensing capacitors $C_{s1}$, $C_{s2}$ between the mobile sensing electrodes 12 and the fixed sensing electrodes 18 of the two halves 11a, 11b of the window 11, and in particular between the rotor electrical-connection pad R and the stator electrical-connection pads $S_1$, $S_2$; and moreover the first and second compensation capacitors $C_{s1-comp}$, $C_{s2-comp}$ between the rotor compensation electrodes 24 and the stator compensation electrodes 21 of the two halves 11a, 11b of the window 11, and in particular between the rotor electrical-connection pad R and the compensation electrical-connection pads $S_{1-comp}$, $S_{2-comp}$. As it will be clear, these capacitors are the result of the parallel connection of all the elementary capacitors formed between the individual facing electrodes, according to the electrical-connection scheme illustrated.

In particular, the arrangement of the sensing electrodes 12, 18 and of the compensation electrodes 21, 24 is such that they substantially undergo the same strains due to the thermo-mechanical stress, both acting in the horizontal plane xy and out of the same horizontal plane xy, along the vertical axis z; substantially similar relative displacements of the anchorages of the same sensing electrodes 12, 18 and of the same compensation electrodes 21, 24 with respect to the rotor anchorage thus occur.

Consequently, the micromechanical structure 1 enables execution, for example in an integrated manner in an ASIC 30 electrically connected to the micromechanical structure 1 (shown schematically only in FIG. 2), of the compensation operations previously described for compensation of the effect of the thermo-mechanical stress on the resulting signal $Sig_r$, supplied at output by the same ASIC 30.

ASIC 30 may be integrated in the die 3 of the micromechanical structure 1, or else it may be integrated in a respective die of semiconductor material, which can be housed in one and the same package together with the die 3 (in a way not illustrated).

In either case, ASIC 30 is electrically connected to the rotor electrical-connection pad R, to the stator electrical-connection pads $S_1$, $S_2$, and to the compensation electrical-connection pads $S_{1-comp}$, $S_{2-comp}$ so as to receive at input, for the subsequent processing operations, the capacitive signals associated to the sensing capacitors $C_{s1}$, $C_{s2}$ and compensation capacitors $C_{s1-comp}$, $C_{s2-comp}$.

In the first embodiment described, the sensing axis (in particular, the second horizontal axis y) coincides with the axis of symmetry (in particular, the second axis of symmetry $A_y$) of the micromechanical structure 1.

In an evident way (as illustrated hereinafter, in FIGS. 5, 8, and 9), a variant embodiment may envisage that the sensing axis is the first horizontal axis x, coinciding once again with the axis of symmetry (in this case the first axis of symmetry $A_x$) of the micromechanical structure 1. In this case, the sensing electrodes 12, 18 and compensation electrodes 21, 24 extend parallel to the second horizontal axis y (in general, the resulting entire mechanical structure is substantially rotated through 90° in the horizontal plane xy). The operating principle is altogether similar to the one illustrated previously.

Figure 4:
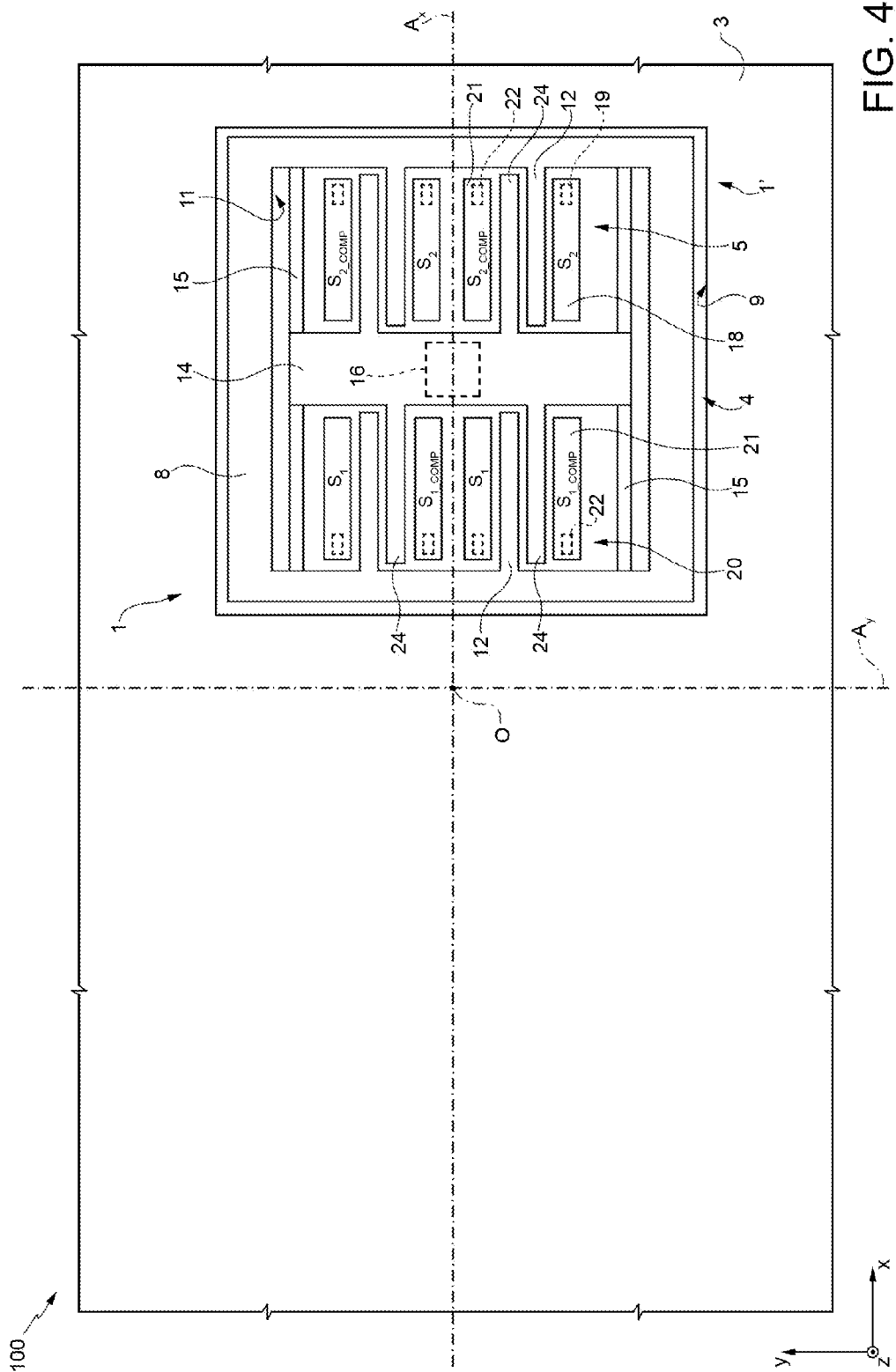
FIG. 4 is a schematic top plan view of a second embodiment of a MEMS device, including a uniaxial micromechanical structure, referred again to a planar movement.

FIG. 4 shows a second embodiment, in which the sensing axis (in this case the second horizontal axis y) is orthogonal to the axis of symmetry (in this case, the first axis of symmetry $A_x$) of the micromechanical structure, here designated by 1' (elements similar to those already described are, instead, designated by the same reference numbers).

In the second embodiment, the micromechanical structure 1' is entirely located on one and the same side of the second axis of symmetry $A_y$ of the die 3, and the stator compensation electrodes 21 are symmetrical to the corresponding fixed sensing electrodes 18 with respect to the first axis of symmetry A. It should be noted that in FIG. 4 and in the subsequent figures, the fixed sensing electrodes 18 and the stator compensation electrodes 21 are distinguished by reference to the associated electrical connection pad, $S_1$-$S_2$, $S_{1\text{-}comp}$-$S_{2\text{-}comp}$ in such a way as to facilitate understanding of the electrical connections.

The principle of operation, in particular as regards compensation of the thermo-mechanical stress, of the micromechanical structure 1' in the second embodiment follows directly from what has been previously illustrated with reference to the first embodiment of FIG. 2.

Figure 5:
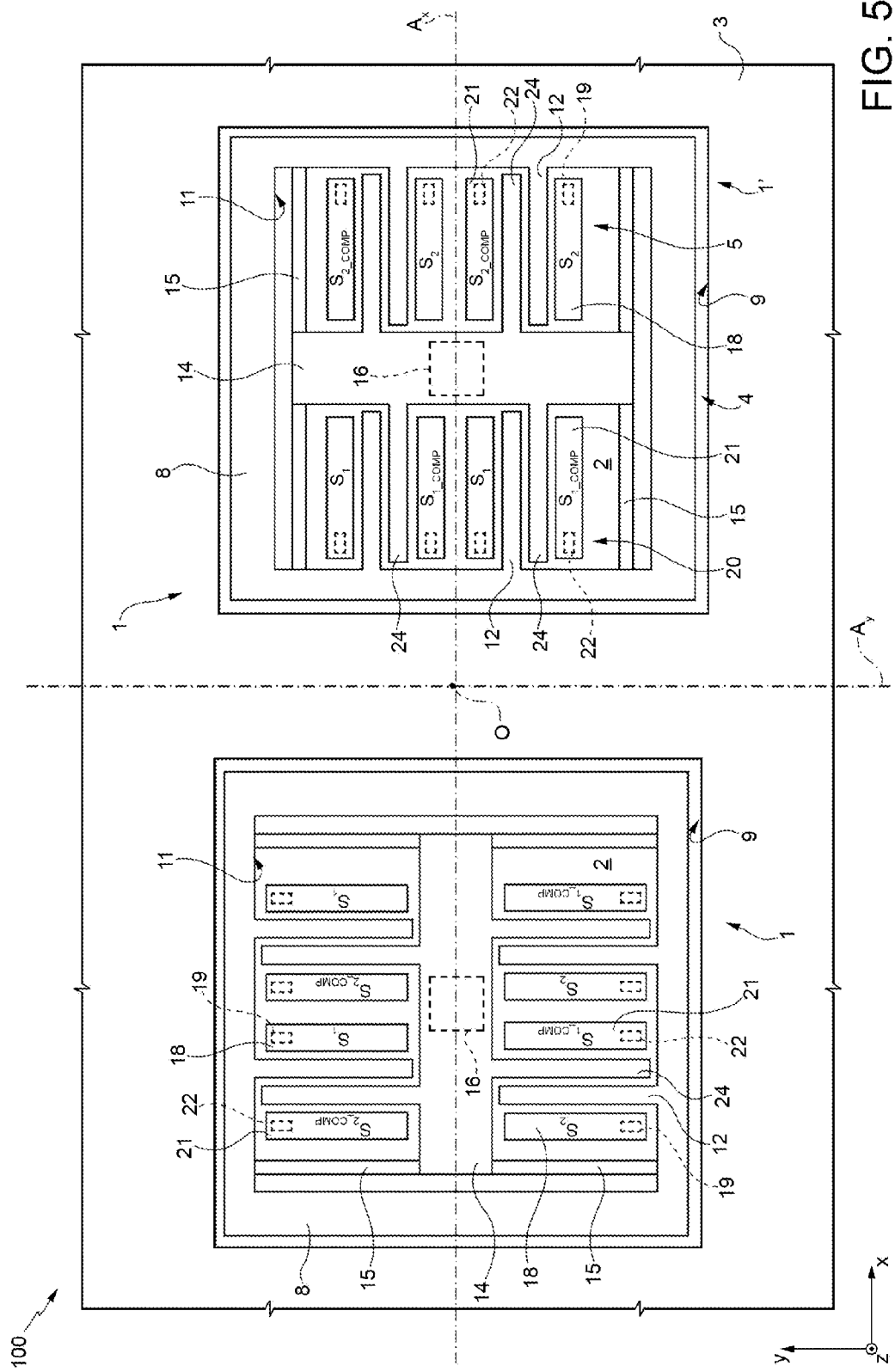
FIG. 5 is a top plan view of a third embodiment, of a biaxial type, of a MEMS device, including a first uniaxial sensing structure and a second uniaxial sensing structure, with integrated compensation of the thermo-mechanical stress, each referred to a respective planar movement.

FIG. 5 shows a third embodiment, relating to a MEMS device 100 implementing a biaxial accelerometer, designed to detect a first component of acceleration and a second component of acceleration in the horizontal plane xy, which act, respectively, along the first horizontal axis x and the second horizontal axis y.

MEMS device 100 in this case comprises a first micromechanical structure 1 and a second micromechanical structure 1', which are designed to detect, respectively, the first and second components of acceleration in the horizontal plane xy, each one made as described previously in detail (and not described any further hereinafter).

In the example illustrated, both of the micromechanical structures 1, 1' are located in a position corresponding to the first axis of symmetry $A_x$ of the die 3 in such a way that the respective stator compensation electrodes 21 and the corresponding fixed sensing electrodes 18 are symmetrical with respect to the same first axis of symmetry A.

In particular, the first micromechanical structure 1 has its sensing axis (in this case, the first horizontal axis x) parallel to the axis of symmetry (in this case, the first axis of symmetry $A_x$). Instead, the second micromechanical structure 1' has its sensing axis (in this case, the second horizontal axis y) orthogonal to the axis of symmetry (in this case, the same first axis of symmetry $A_x$).

Figure 6:
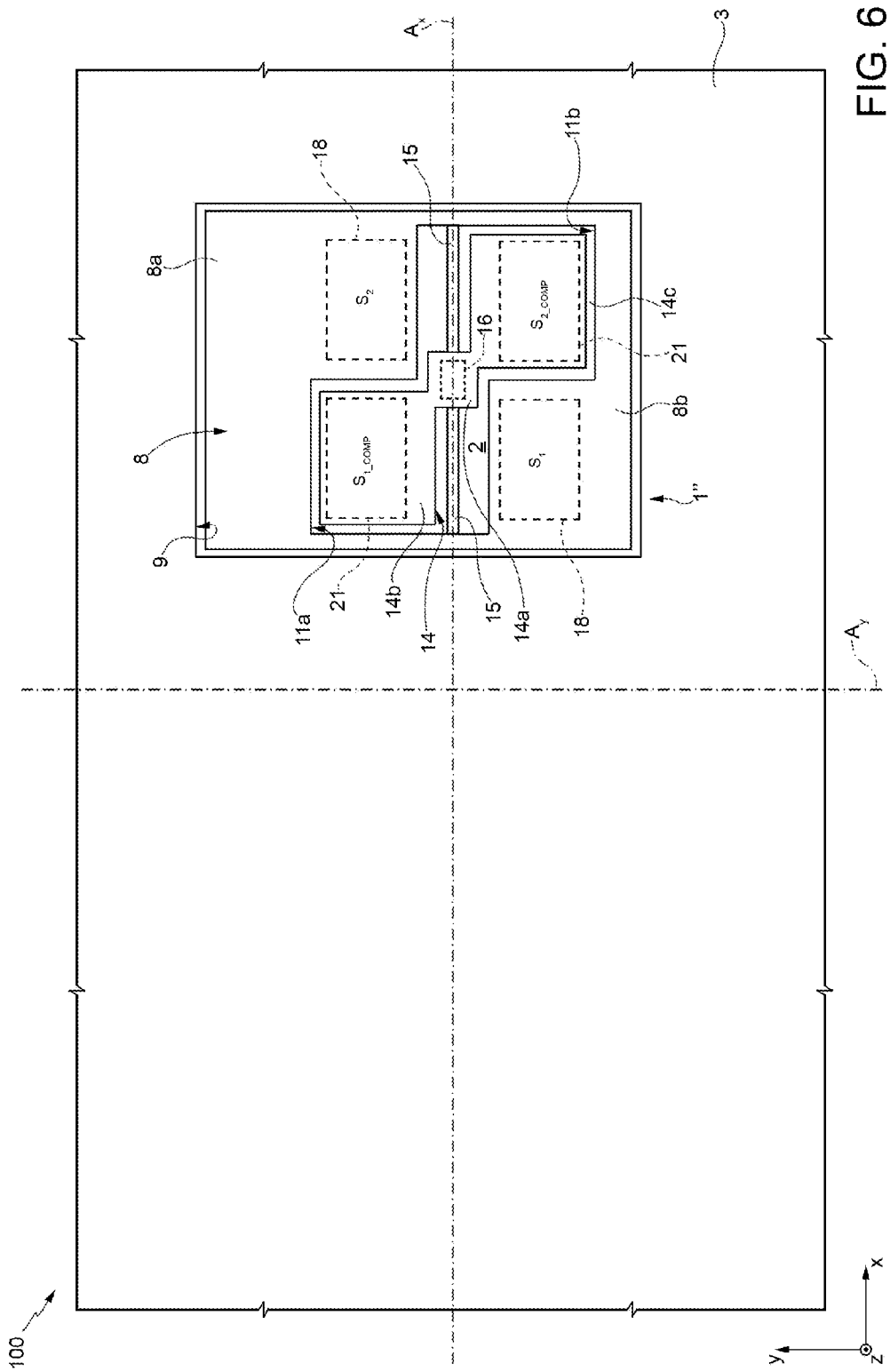
FIGS. 6-7 are top plan views of a fifth embodiment and of a sixth embodiment, respectively, of a MEMS device, including a uniaxial sensing structure with integrated compensation of the thermo-mechanical stress, referred to an out of plane movement.

FIG. 6 shows a fourth embodiment, relating to a MEMS device 100 that implements once again a uniaxial accelerometer, in this case designed to detect a component of acceleration out of the horizontal plane xy, acting along the vertical axis z.

In the micromechanical structure, designated here by 1", the mobile sensing electrodes 12 are not envisaged, nor are the rotor compensation electrodes 24, in so far as the suspended mass 8 and the suspension body 14 themselves operate as electrodes, facing and being capacitively coupled to the corresponding fixed sensing electrodes 18 and to the corresponding stator compensation electrodes 21. The fixed sensing electrodes 18 and stator compensation electrodes 21 are in this case arranged on the substrate 2 of the die 3, underneath the suspended mass 8 and the suspension body 14 (for this reason, the stator anchorage portions 19 and the compensation anchorage portions 22 are not present, either).

The window 11 defined within the suspended mass 8 here has the first and second halves 11a, 11b set on opposite sides of the axis of symmetry of the micromechanical structure 1 (here, the first axis of symmetry $A_x$ of the die 2). The suspended mass 8 is set entirely on one and the same side of the second axis of symmetry $A_y$ of the die 3.

The suspension body 14 has: a central portion 14a, set along the first axis of symmetry $A_x$ and fixed with respect to the rotor anchorage portion 16; and a first side portion 14b and a second side portion 14c, arranged respectively in the first and second halves 11a, 11b of the window 11, on opposite sides of the first axis of symmetry $A_x$, each having a substantially rectangular shape in the horizontal plane xy.

The elastic elements 15 here include two longitudinal springs, which are arranged along the first axis of symmetry $A_x$, on opposite sides of the central portion 14a, and connect the central portion 14a to the suspended mass 8.

The suspended mass 8 has a mass distribution that is asymmetrical with respect to the axis of extension of the elastic elements 15, with a first portion 8a and a second portion 8b, in this case set on opposite sides of the first axis of symmetry $A_x$, having a different extension along the second horizontal axis y and different masses. It follows that, by the inertial effect, in the presence of a component of acceleration along the vertical axis z, the suspended mass 8 rotates out of the horizontal plane xy about the elastic elements 15, approaching, with a first portion 8a (or 8b) thereof, the substrate 2 of the die 3, and receding therefrom accordingly with its second portion 8b (or 8a).

Arranged underneath the first and second side portions 14b, 14c are respective stator compensation electrodes 21, formed on the substrate 2 and having a shape substantially corresponding to that of the first and second side portions 14b, 14c.

A respective fixed sensing electrode 18 is moreover set in a position symmetrical to each stator compensation electrode 21 with respect to the first axis of symmetry $A_x$; the respective fixed sensing electrode 18 is also formed on the substrate 2 and set underneath a respective first portion 8a or second portion 8b of the suspended mass 8. The fixed sensing electrodes 18 and the stator compensation electrodes 21 have substantially the same shape and the same area in the horizontal plane xy (corresponding to the facing and capacitive-coupling surface).

The operating principle of the micromechanical structure 1" is altogether equivalent to what has been described for the previous embodiments, allowing once again compensation of the thermo-mechanical stress, due to the integrated presence of the compensation structure 20.

Also in this case, in fact, the fixed sensing electrodes 18 and the corresponding stator compensation electrodes 21 are set at one and the same distance from the axes of symmetry $A_x$, $A_y$ of the die 3, hence undergoing substantially the same thermo-mechanical strains (acting both in the horizontal plane xy and out of the same horizontal plane xy).

Figure 7:
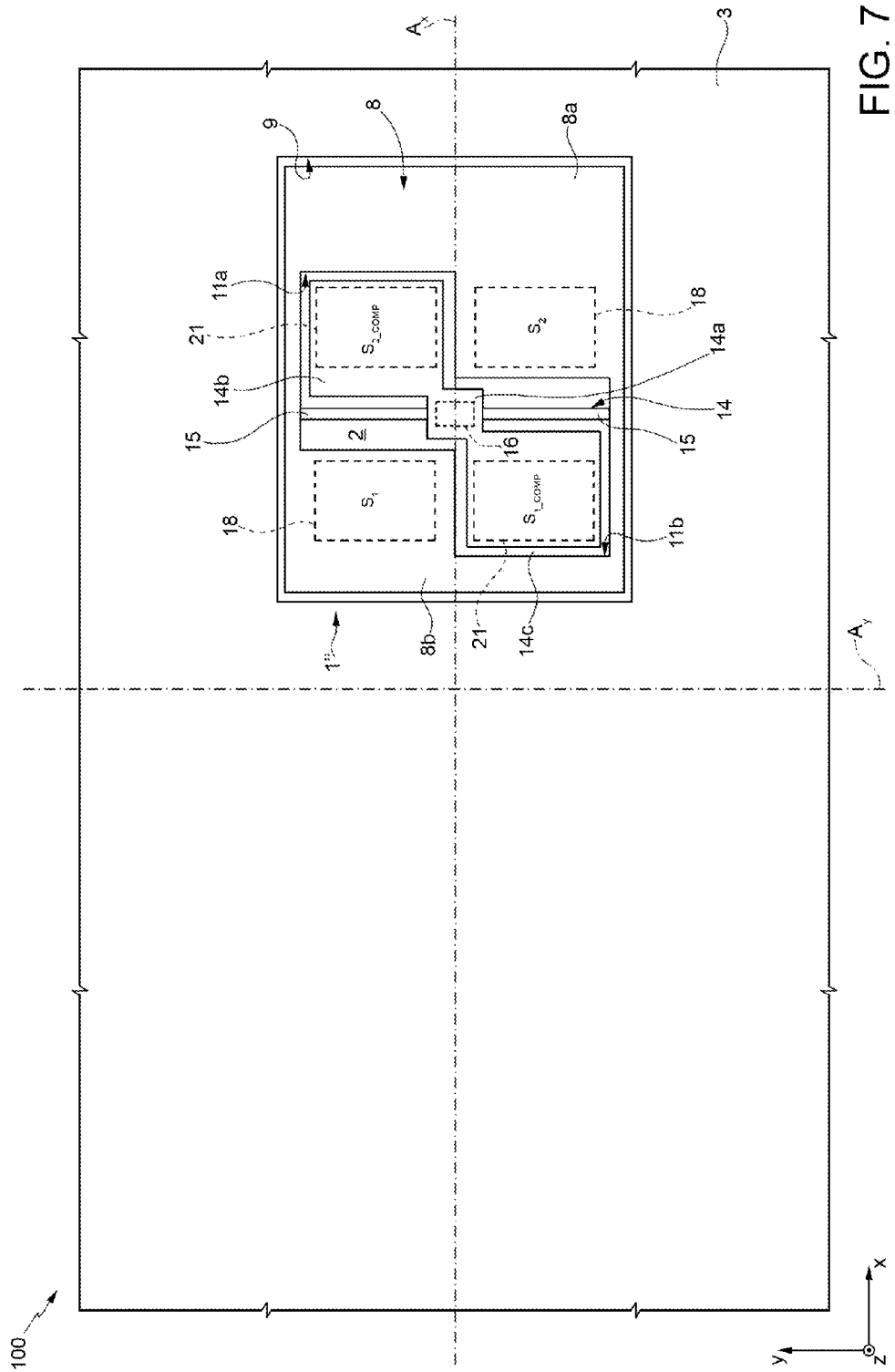

A sixth embodiment, shown in FIG. 7, once again relates to a MEMS device 100 implementing a uniaxial accelerometer designed to detect a component of acceleration along the vertical axis z; this embodiment differs from the one just illustrated in that the elastic elements 15 coupled to the suspended mass 8 are aligned along the second horizontal axis y, enabling a rotation of the suspended mass 8 about an axis parallel to the second axis of symmetry $A_y$ of the die 3 (in general, the entire resulting mechanical structure is substantially rotated through 90° in the horizontal plane xy).

As regards operation of the micromechanical structure 1", considerations altogether similar to those already discussed in detail previously apply to this embodiment.

Figure 8:
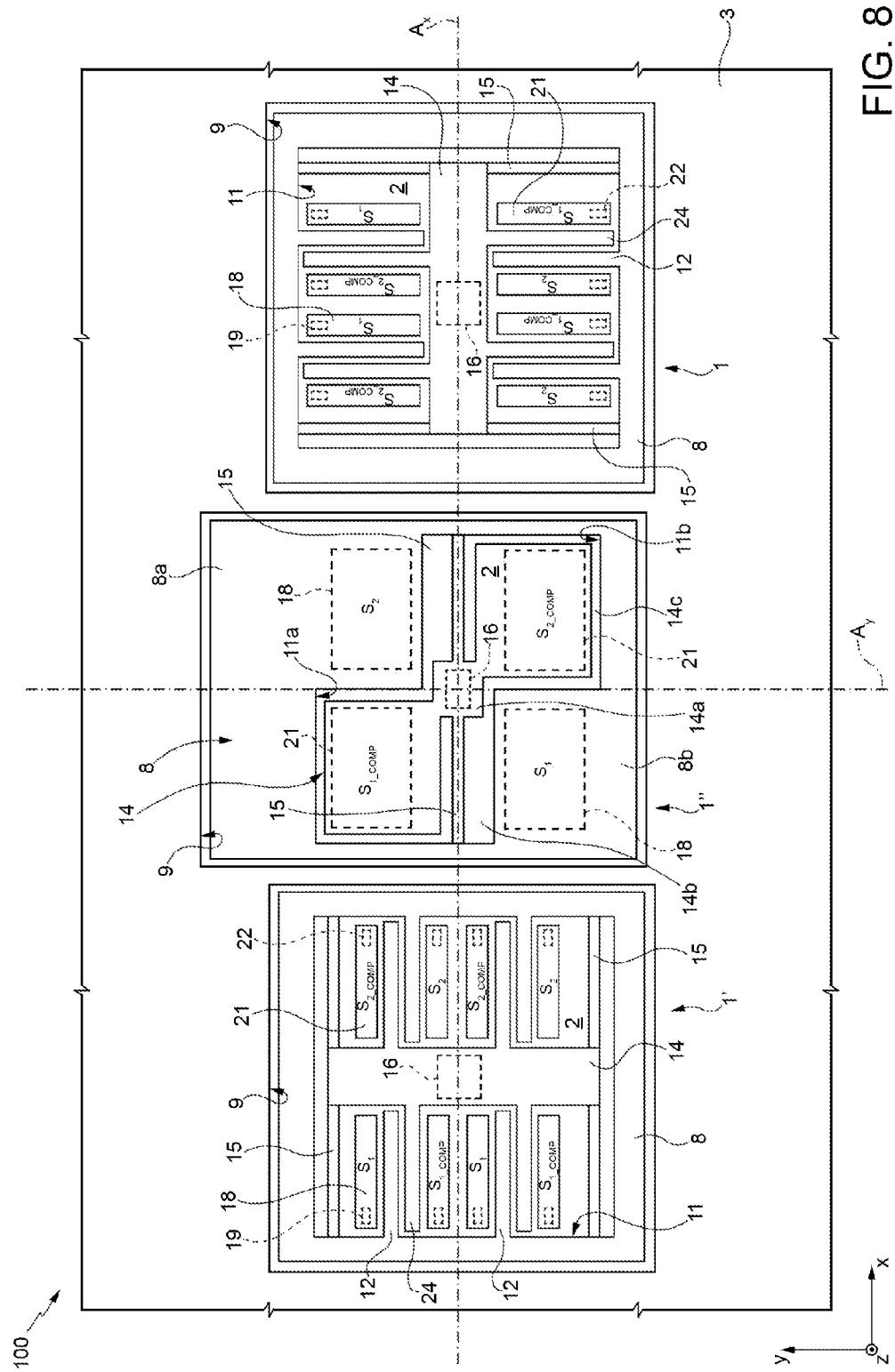
FIGS. 8-9 are top plan views of a seventh embodiment and of an eighth embodiment, respectively, of a MEMS device, of a triaxial type, including a first uniaxial sensing structure and a second uniaxial sensing structure, each referred to a respective planar movement, and moreover of a third uniaxial sensing structure, referred to an out of plane movement.
Figure 9:
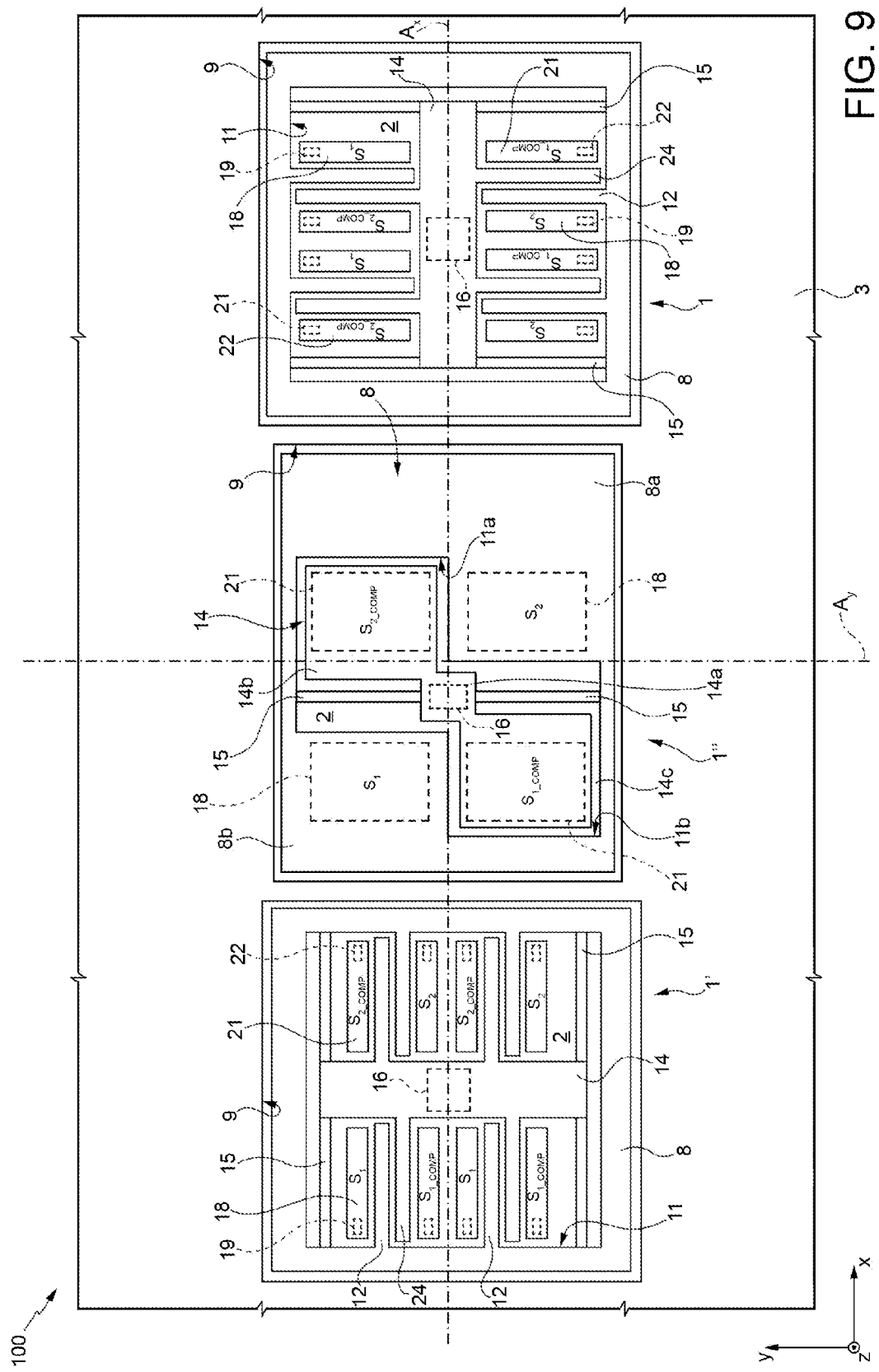

In the embodiments shown in FIGS. 8 and 9, the MEMS device 100 implements a triaxial detection, in particular a detection of respective components of acceleration acting along the first and second horizontal axes x, y and along the vertical axis z.

For this purpose, the MEMS device 100 comprises three distinct micromechanical structures, each of a uniaxial type and provided with integrated compensation of the thermo-mechanical stress, and in particular: a first micromechanical structure, designated once again by 1, for detection of a component of acceleration directed along the first horizontal axis x; a second micromechanical structure 1' for detection of a component of acceleration directed along the second horizontal axis y; and a third micromechanical structure 1" for detection of a component of acceleration directed along the vertical axis z.

In the examples shown, the axis of symmetry for the three micromechanical structures 1, 1', 1" is constituted by the first axis of symmetry $A_x$ (but it is understood that similar considerations may be made for the second axis of symmetry $A_y$, also according to the conformation of the die 3). The three micromechanical structures 1, 1', 1" are moreover aligned along the first axis of symmetry $A_x$, with the respective rotor anchorage portions 16 arranged along the same first axis of symmetry A.

As will be clear from an examination of FIGS. 8 and 9, the two embodiments shown in the same FIGS. 8 and 9 differ only as regards the different arrangement of the third micromechanical structure 1".

The advantages of the solution described are clear from the foregoing discussion.

In any case, it is emphasized again that a complete temperature compensation of the strains and stresses is carried out, integrated in the micromechanical structure 1, 1', 1" of a MEMS device 100.

In particular, the solution described enables compensation both of strains acting in the horizontal plane xy and of strains acting out of the horizontal plane xy, without requiring a substantial increase of the occupation of area or of the complexity of implementation, and consequently of the manufacturing costs, of the micromechanical structure 1, 1', 1".

Moreover, the compensation solution advantageously applies to uniaxial, biaxial or triaxial MEMS devices 100 and is particularly indicated for portable applications or in general for applications that specify a reduction of the overall dimensions.

Finally, it is clear that modifications and variations may be made to what has been described and illustrated herein, without thereby departing from the scope of the present disclosure.

In particular, it is evident that the shape and arrangement of the elements that constitute the micromechanical structures 1, 1', 1" may undergo variations with respect to the embodiments illustrated, for example as regards the shape of the mobile and/or fixed electrodes, and/or of the masses.

The micromechanical structures 1, 1', 1" may alternatively be arranged centrally with respect to the die 3 of semiconductor material, symmetrically with respect to its geometrical center O.

Further combinations of the uniaxial micromechanical structures, additional to the ones illustrated, may also be envisaged, for providing further types of biaxial and/or triaxial MEMS devices 100.

The capacitive sensing and compensation scheme implemented may not be of a differential type, and hence envisage definition of a single sensing capacitor and of a single compensation capacitor.

Moreover, the compensation solution described may find advantageous application also for further types of micromechanical structures 1, 1', 1", for example in structures in which actuation of the suspended mass 8 is envisaged by means of an appropriate electrical biasing of the electrodes associated thereto (for example, in gyroscopic sensors).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micromechanical structure having a first axis of symmetry, the micromechanical structure comprising:
   a semiconductor substrate;
   a stator structure that is fixed with respect to said substrate and includes fixed sensing electrodes;
   a rotor structure including a suspended mass elastically coupled to a suspension body, the suspended mass being mobile with respect to said substrate and to said stator structure in response to an external acceleration, the suspension body fixed to said substrate, said fixed sensing electrodes being capacitively coupled to said rotor structure; and
   a compensation structure configured to compensate for thermo-mechanical strains that occur within said mircomechanical structure, said compensation structure including stator compensation electrodes that are fixed with respect to said substrate and are capacitively coupled to said rotor structure, the stator compensation electrodes being distinct from the fixed sensing electrodes, the stator compensation electrodes being symmetrically arranged relative to said fixed sensing electrodes with respect to the first axis of symmetry, the first axis of symmetry extending along a longitudinal axis of the suspension body.

2. The micromechanical structure according to claim 1, wherein:
   said micromechanical structure has a second axis of symmetry that is orthogonal to said first axis of symmetry; and
   each stator compensation electrode being arranged a first distance from the second axis of symmetry, each of the fixed sensing electrodes being arranged a second distance from the second axis of symmetry, the second distance being substantially equal to the first distance.

3. The micromechanical structure according to claim 1, wherein:
   stator compensation electrodes of a first set are configured to be electrically coupled to one another and define with said rotor structure a first compensation capacitor; and
   fixed sensing electrodes of a second set that are symmetrical to the stator compensation electrodes of the first set with respect to the first axis of symmetry, the fixed sensing electrodes of the second set being electrically coupled to one another and defining with said rotor structure a first sensing capacitor, the first sensing capacitor being configured to generate a capacitive variation due to said thermo-mechanical strains that is compensated for by a corresponding capacitive variation of said first compensation capacitor.

4. The micromechanical structure according to claim 1, wherein in an absence of the external acceleration, a first distance from the rotor structure to each stator compensation electrode is substantially equal to a second distance from the rotor structure to the fixed sensing electrode.

5. The micromechanical structure according to claim 1, wherein said rotor structure includes a window, said suspension body being arranged in said window, the micromechanical structure further including elastic elements, said suspended mass being electrically and elastically coupled to said suspension body by the elastic elements, and wherein said stator compensation electrodes are arranged in said window and are facing and capacitively coupled to said suspension body.

6. The micromechanical structure according to claim 5, wherein:
said suspended mass is configured to move in a first direction and includes mobile sensing electrodes that extend within said window facing at a first distance apart from and capacitively coupled to corresponding electrodes of said fixed sensing electrodes; and
said suspension body includes rotor compensation electrodes facing at a second distance apart from and capacitively coupled to corresponding electrodes of said stator compensation electrodes, and wherein in the absence of the external acceleration, the first distance being substantially equal to the second distance.

7. The micromechanical structure according to claim 6, further comprising anchorage elements, wherein each stator compensation electrodes is fixedly coupled to said substrate by a respective anchorage element.

8. The micromechanical structure according to claim 6, wherein said first axis of symmetry is parallel to said first direction, and wherein said suspension body has a portion that is located at said first axis of symmetry.

9. The micromechanical structure according to claim 6, wherein said first axis of symmetry is orthogonal to said first direction, and wherein said suspension body has a portion that is located at said first axis of symmetry.

10. The micromechanical structure according to claim 5, wherein said fixed sensing electrodes face said suspended mass along a vertical axis orthogonal to a surface of the substrate, and said stator compensation electrodes face said suspension body along said vertical axis, and wherein said suspended mass is configured to move in a direction that is out of a plane defined by the surface of the substrate.

11. The micromechanical structure according to claim 1, wherein the fixed sensing electrodes and the rotor structure are configured to detect a component of linear acceleration acting in a first direction.

12. A MEMS device comprising:
a first micromechanical structure having a first axis of symmetry, the micromechanical structure including:
a semiconductor substrate;
a stator structure fixed to the substrate and includes fixed sensing electrodes;
a rotor structure including a suspended mass having mobile sensing electrodes and a suspension body having rotor compensation electrodes, the suspended mass and the mobile sensing electrodes being moveable relative to the substrate and to the stator structure in response to an external acceleration, the suspension body fixed to the substrate, the fixed sensing electrodes being capacitively coupled to the mobile sensing electrodes; and
a compensation structure configured to compensate for thermo-mechanical strains that occur within the mircomechanical structure, the compensation structure including stator compensation electrodes that are fixed with respect to the substrate and are capacitively coupled to the rotor compensation electrodes, the compensation electrodes being symmetrically arranged relative to the fixed sensing electrodes with respect to the first axis of symmetry, the mobile sensing electrodes being symmetrically arranged relative to the rotor compensation electrodes with respect to the first axis of symmetry, the first axis of symmetry extending along a longitudinal axis of the suspension body; and
an electronic circuit coupled to the first micromechanical structure and configured to determine a capacitive sensing signal as a function of a first capacitance of a first sensing capacitor formed between said fixed sensing electrodes and the mobile sensing electrodes and determine a capacitive compensation signal as a function of a second capacitance of a first compensation capacitor formed between the stator compensation electrodes and the rotor compensation electrodes, wherein the electronic circuit is further configured to determine a resulting signal that compensates for thermo-mechanical strain as a function of the capacitive sensing signal and the capacitive compensation signal.

13. The MEMS device according to claim 12, wherein said electronic circuit is an ASIC.

14. The MEMS device according to claim 12, wherein said electronic circuit is configured to determine said resulting signal as a function of a difference between said capacitive sensing signal and said capacitive compensation signal.

15. The MEMS device according to claim 12, further comprising a second micromechanical structure similar to the first mechanical structure, said MEMS device is configured to respond to a first external acceleration acting along a first axis and to a second external acceleration acting along a second axis, the second axis being perpendicular to the first axis.

16. The MEMS device according to claim 15, further comprising a third micromechanical structure similar to the first micromechanical structure, said MEMS device being configured to respond to a third external action acting along a vertical axis that is orthogonal to a plane of said MEMS device.

17. The MEMS device according to claim 12, wherein said electronic circuit is configured to differentially determine said capacitive sensing signal as a function of a second sensing capacitor formed between said fixed sensing electrodes and said rotor structure, and to differentially determine said capacitive compensation signal as a function of a second compensation capacitor formed between said stator compensation electrodes and said rotor structure.

18. A micromechanical structure having a first axis of symmetry and a second axis of symmetry perpendicular to the first axis, the micromechanical structure comprising:
a semiconductor substrate having a surface;
a stator structure that is fixed to the surface and includes fixed sensing electrodes;
a rotor structure that includes rotor sensing electrodes that move relative to the substrate and to said stator structure in response to an external acceleration, each of the fixed sensing electrodes being capacitively coupled to a respective rotor sensing electrode and forming a sensing capacitor;
a compensation rotor structure that is fixed to the surface and includes compensation rotor electrodes;
a compensation stator structure that includes fixed compensation stator electrodes, each of the fixed compensation stator electrodes being capactively coupled to a respective compensation rotor electrode and forming a compensation capacitor, the compensation capacitors being symmetrically arranged relative to the sensing capacitors with respect to the first axis of symmetry, the first axis of symmetry extending along a longitudinal axis of the compensation rotor structure.

19. The micromechanical structure according to claim 18, wherein the compensation rotor structure is elastically coupled to the rotor structure and coupled to the substrate.

20. The micromechanical structure according to claim 19, further comprising elastic elements located at ends of the compensation rotor structure, wherein the compensation rotor structure is coupled to the rotor structure by the elastic elements.

21. The micromechanical structure according to claim 19, wherein a center portion of the compensation rotor structure is coupled to the substrate.

22. The micromechanical structure according to claim 18, wherein the compensation capacitors are symmetrically arranged relative to the sensing capacitors with respect to the second axis of symmetry.

\* \* \* \* \*